(12) United States Patent
Matsumura et al.

(10) Patent No.: US 7,700,490 B2
(45) Date of Patent: Apr. 20, 2010

(54) SEMICONDUCTOR MANUFACTURING METHOD FOR REMOVING RESIDUE GENERATED BY DRY ETCHING

(75) Inventors: Tsuyoshi Matsumura, Hiratsuka (JP); Kazuhiko Takase, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 554 days.

(21) Appl. No.: 11/655,100

(22) Filed: Jan. 19, 2007

(65) Prior Publication Data
US 2007/0178702 A1 Aug. 2, 2007

(30) Foreign Application Priority Data
Jan. 31, 2006 (JP) .............................. 2006-023486

(51) Int. Cl.
*H01L 21/311* (2006.01)
(52) U.S. Cl. .................. 438/700; 438/444; 438/689; 438/704; 438/706; 438/963
(58) Field of Classification Search ................. 438/444, 438/689, 700, 704, 706, 963
See application file for complete search history.

(56) References Cited
U.S. PATENT DOCUMENTS

| | | | |
|---|---|---|---|
| 6,309,977 B1 * | 10/2001 | Ting et al. .................... | 438/706 |
| 6,465,352 B1 * | 10/2002 | Aoki ........................... | 438/689 |
| 6,527,968 B1 * | 3/2003 | Wang et al. .................. | 216/67 |
| 6,797,627 B1 * | 9/2004 | Shih et al. .................... | 438/694 |
| 6,812,120 B1 * | 11/2004 | Young et al. ................. | 438/589 |
| 7,018,552 B2 * | 3/2006 | Uematsu et al. .............. | 216/13 |
| 7,199,059 B2 * | 4/2007 | Cheng et al. ................. | 438/706 |
| 7,279,428 B2 * | 10/2007 | Lin et al. ..................... | 438/710 |
| 7,347,951 B2 * | 3/2008 | Uematsu et al. .............. | 216/18 |
| 2001/0014534 A1 * | 8/2001 | Aoki et al. ................... | 438/689 |

FOREIGN PATENT DOCUMENTS

| | | |
|---|---|---|
| JP | 05-088757 | 4/1993 |
| JP | 2005-217114 | 8/2005 |

* cited by examiner

*Primary Examiner*—Andy Huynh
(74) *Attorney, Agent, or Firm*—Finnegan, Henderson, Farabow, Garrett & Dunner, L.L.P.

(57) ABSTRACT

A residue treatment system includes a treatment tank which treats residue with etching fluid, the residue being generated in a trench formed in an insulating film by dry etching; a measurement unit which measures a characteristic amount of the etching fluid; and a control unit which calculates treatment time for removing the residue on the basis of a value obtained by measuring the characteristic amount, the control unit calculating the treatment time by using correlation between an etching rate of the insulating film and the characteristic amount.

4 Claims, 5 Drawing Sheets

74: TRENCH
76: RESIDUE 60,66,68: INSULATING FILM　　70: RESIST FILM
62: BARRIER LAYER　　72: OPENING
64: CONDUCTIVE FILM

74: TRENCH
76: RESIDUE

SEMICONDUCTOR MANUFACTURING METHOD FOR REMOVING RESIDUE GENERATED BY DRY ETCHING

CROSS-REFERENCE TO RELATED APPLICATION

This application is based upon and claims the benefit of priority from the prior Japanese Patent Application No. 2006-23486, filed on Jan. 31, 2006, the entire contents of which are incorporated herein by reference.

BACKGROUND OF THE INVENTION

1. Field of the Invention

The present invention relates to a residue treatment system, a residue treatment method, and a method of a manufacturing semiconductor device which remove residue generated by dry etching for an insulating film.

2. Related Art

With an increase in processing speed of a semiconductor device such as a large-scale integrated circuit (LSI), micro-patterning and high integration of elements such as transistors used in the semiconductor device are advanced. In such a semiconductor device, elements and multilayer interconnections are connected by conductive vias, contacts, and the like buried in an insulating interlayer deposited on a semiconductor substrate. For example, in order to form interconnections and conductive vias for connecting between wiring layers, trenches and via holes are formed in an insulating interlayer by dry etching such as reactive ion etching. To the side walls and the bottom surfaces of the trenches and the via holes, polymer which is a reaction product in dry etching on the insulating interlayer adheres as residue. The adhering residue causes not only an increase in resistance between wiring layers but also deterioration of a wiring metal, the conductive vias, and the like by corrosion.

Residue generated by dry etching for an insulating interlayer or the like can be selectively removed by a wet etching treatment using a etching fluid (for example, see Japanese Patent Application Laid-open No. 2005-217114). In general, the wet etching treatment in a residue removing step is performed such that the etching fluid is circulated by a circulating system. In the circulating process, residue removing treatment for a large number of semiconductor substrates can be performed by repeatedly uses the etching fluid. For this reason, number of times of waste liquid treatment is reduced to make it possible to suppress the cost of etching fluid.

In the residue removing step, residue is removed by being selectively etched. However, in fact, an insulating interlayer or the like to which residue adheres is also etched. The residue contains a reactive gas component used in dry etching, and the reactive gas component is solved in the etching fluid. The etching characteristics of the etching fluid are adversely affected by the dissolved reactive gas component. For example, in the circulating process, when residue removal is repeated, an etching rate to the insulating interlayer increases. With the increase in etching rate, processing conversion differences between trenches and via holes formed in the insulating interlayer increase. As a result, a capacitance between interconnections or wiring layers increases to deteriorate the performance of a semiconductor device.

At the present, an etching rate of an insulating film immediately before residue removal is checked each time to treat a semiconductor substrate. As a result, time required for the residue removing step increases to cause an increase in manufacturing cost.

SUMMARY OF THE INVENTION

A residue treatment system according to an embodiment of the present invention comprises a treatment tank which treats residue with etching fluid, the residue being generated in a trench formed in an insulating film by dry etching; a measurement unit which measures a characteristic amount of the etching fluid; and a control unit which calculates treatment time for removing the residue on the basis of a value obtained by measuring the characteristic amount, the control unit calculating the treatment time by using correlation between an etching rate of the insulating film and the characteristic amount.

A residue treatment method according to an embodiment of the present invention comprises measuring a value of a characteristic amount of a target etching fluid; calculating a target etching rate on the basis of the measured value by using correlation between the characteristic amount of a reference etching fluid and a reference etching rate of a reference insulating film, the correlation being obtained by etching the reference insulating film with the reference etching fluid; and calculating treatment time for removing residue on the basis of the calculated target etching rate, the residue being generated in the trench formed by dry etching of a target insulating film.

A method of manufacturing a semiconductor device according to an embodiment of the present invention comprises depositing a target insulating film on a semiconductor substrate; selectively etching a part of the target insulating film by dry etching to form a trench; measuring a value obtained by measuring a characteristic amount of target etching fluid which removes residue generated in the trench; calculating treatment time for removing the residue on the basis of the measured value by using correlation between a characteristic amount of a reference etching fluid and a reference etching rate of a reference insulating film, the correlation being obtained by etching the reference insulating film with the reference etching fluid; removing the residue with the target etching fluid for the calculated treatment time.

DETAILED DESCRIPTION OF THE INVENTION

Figure 1:
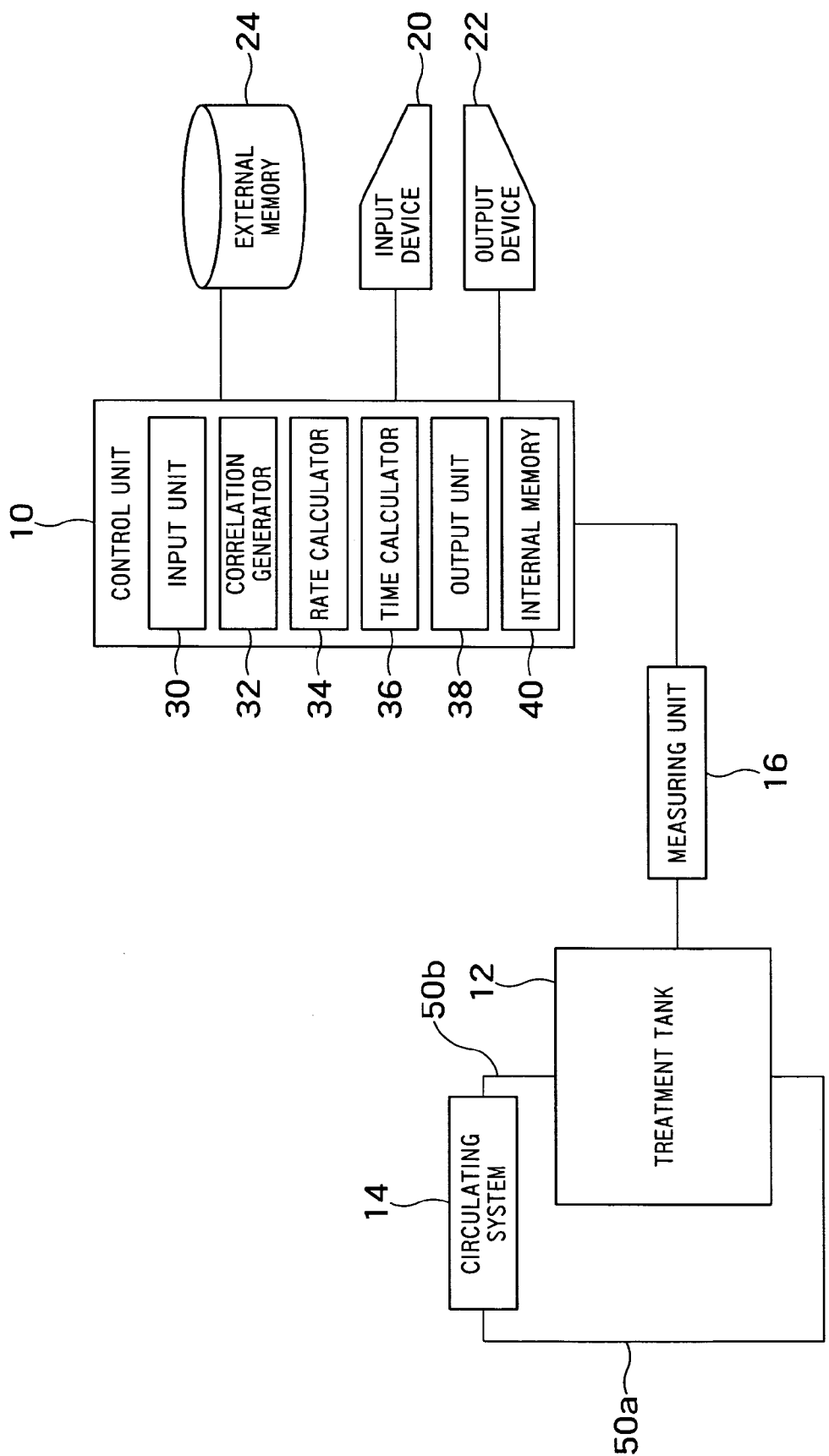
FIG. 1 shows an embodiment of a residue treatment system according to the present invention.

Embodiments of the present invention will be described below with reference to the accompanying drawings. In the descriptions in the drawings (will be described below), the same or the similar reference numerals as in the drawings denote the same or the similar parts in the drawings. However, the drawings are typical, and it must be noticed that relationships between thicknesses and planar dimensions, a ratio of thicknesses of layers, and the like are different from real ones. Therefore, concrete thicknesses and dimensions must be determined in consideration of the following explanation. The drawings include parts are different from each other in relationships between dimensions and ratios, as a matter of course.

First Embodiment

A residue treatment system according to an embodiment of the present invention, as shown in FIG. 1, includes a control unit 10, a treatment tank 12, a circulating system 14, a measuring unit 16, an input device 20, an output device 22, and an external memory 24. The control unit 10 includes an input unit 30, a correlation generator 32, a rate calculator 34, a time calculator 36, an output unit 38, an internal memory 40, and the like. The circulating system 14 is connected to the treatment tank 12 through pipes 50a and 50b.

The treatment tank 12 stores etching fluid which removes residue generated by dry etching for an insulating film. The circulating system 14 circulates the etching fluid through the pipes 50a and 50b. The measuring unit 16 measures a characteristic amount of the etching fluid in the treatment tank 12.

In the control unit 10, a reference insulating film is etched by a reference etching fluid to provide correlation between a reference etching rate to the reference insulating film and a characteristic amount of the reference etching fluid. From a value obtained by measuring the characteristic amount of a target etching fluid, a target etching rate is calculated by using the reference etching rate and the characteristic amount. From the calculated target etching rate, treatment time for removing residue generated in a trench formed by dry etching for a target insulating film.

For example, a step of removing residue such as polymer generated by dry etching for forming a trench such as a via hole in an insulating film such as an insulating interlayer will be described below.

Figure 2:
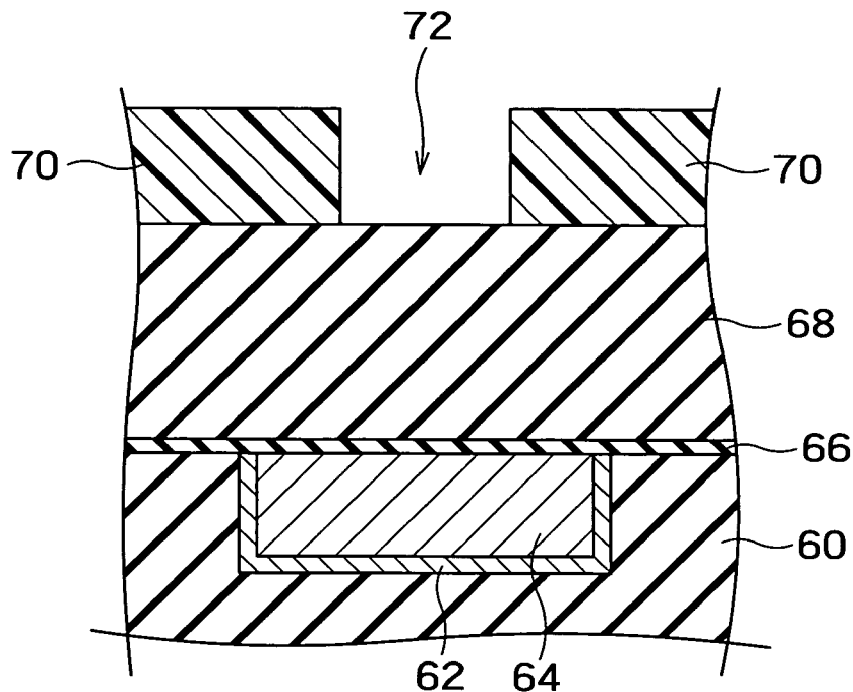
FIG. 2 is a first cross-sectional view showing an embodiment of a method of manufacturing semiconductor device according to the present invention.

As shown in FIG. 2, a barrier layer 62 and a conductive film 64 are formed as underlying interconnections on an insulating film 60 on a semiconductor substrate (not shown). An insulating film 66 is formed on the underlying interconnections and the insulating film 60. An insulating film 68 is formed on the surface of the insulating film 66. A resist film 70 having an opening 72 is formed on the surface of the insulating film 68 by photolithography or the like.

Figure 3:
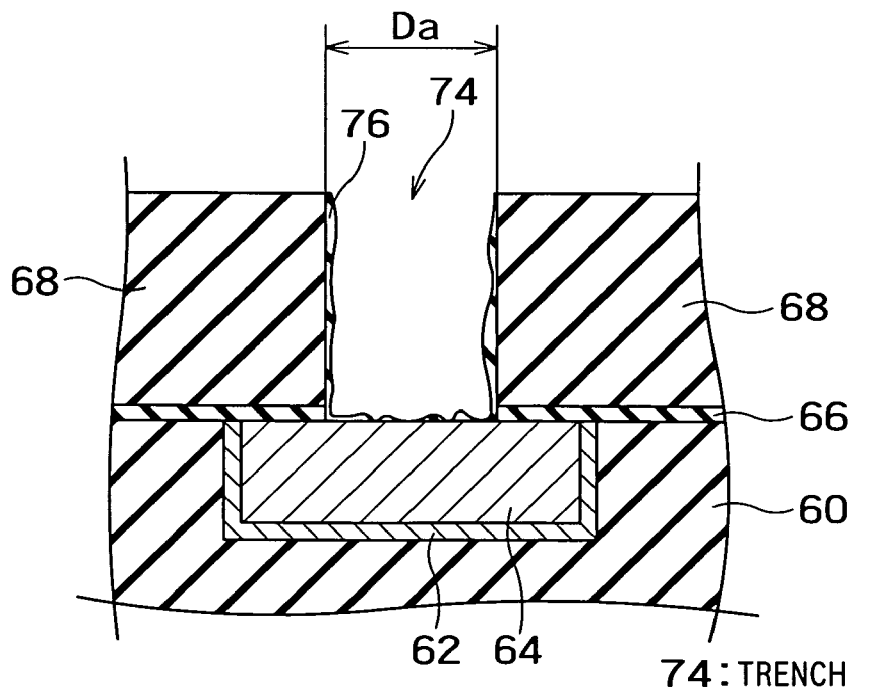
FIG. 3 is a second cross-sectional view showing an embodiment of a method of manufacturing semiconductor device according to the present invention.

As shown in FIG. 3, the insulating film 68 and 66 are selectively removed by dry etching using the resist film 70 as a mask. A trench 74 is formed to expose the surface of the conductive film 64. The trench 74 has a width Da corresponding the opening width of the opening 72. Polymer serving as a reaction product of the dry etching remains on the side walls and the bottom surface of the trench 74 as residue 76.

Figure 4:
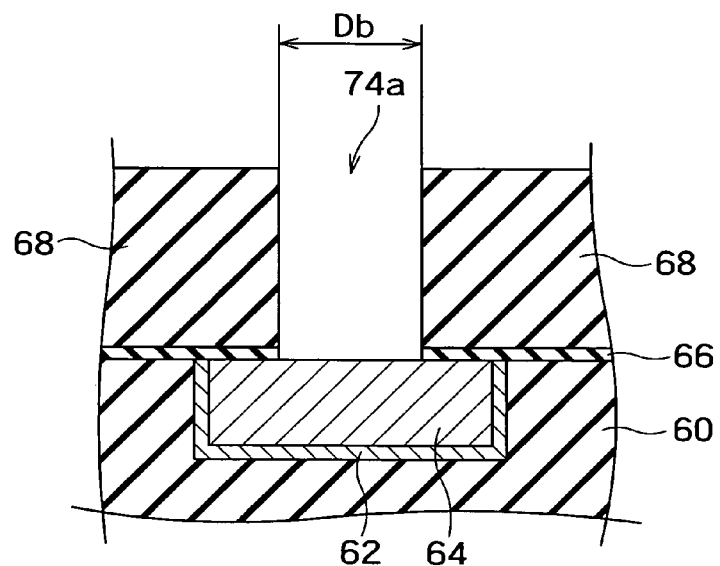
FIG. 4 is a third cross-sectional view showing an embodiment of a method of manufacturing semiconductor device according to the present invention.

The semiconductor substrate is dipped in the etching fluid in the treatment tank 12 to perform removing treatment for the residue 76. As a result, as shown in FIG. 4, the residue 76 is removed to form a trench 74a having a width Db.

The insulating films 60 and 68 are insulating interlayers such as low-dielectric (low-k) insulating films, silicon oxide ($SiO_2$) films, and laminate films constituted by a low-k insulating film and an $SiO_2$ film. As a material of the low-k insulating film, an inorganic material such as carbon-added silicon oxide (SiOC) or inorganic spin-on glass (SOG), or an organic material such as organic SOG may be used. As the low-k insulating film, a laminate film constituted by an inorganic material film and an organic material film may be used. The insulating film 66 is a diffusion-preventing film which prevents metal atoms such as copper atoms (Cu) or aluminum (Al) atoms used in the conductive film 64 from diffusing. As the insulating film 66, a silicon nitride ($Si_3N_4$) film, a silicon carbide (SiC) film, a nitride-added silicon carbide (SiCN) film, or the like is used.

As the dry etching, reactive ion etching (RIE) or the like using a reactive gas is used. As the reactive gas, a gas containing fluorine such as a fluorocarbon gas is used. As the fluorocarbon gas, for example, carbon tetrafluoride ($CF_4$), methane trifluoride ($CHF_3$), hexafluoroethane ($C_2F_6$), or the like is used.

The etching fluid is chemical which can selectively etch the residue 76 generated by dry etching for the insulating films 66 and 68 and the conductive film 64. As the etching fluid, a solution containing fluorine or the like, a solution containing an amino acid or the like, is used.

Figure 5:
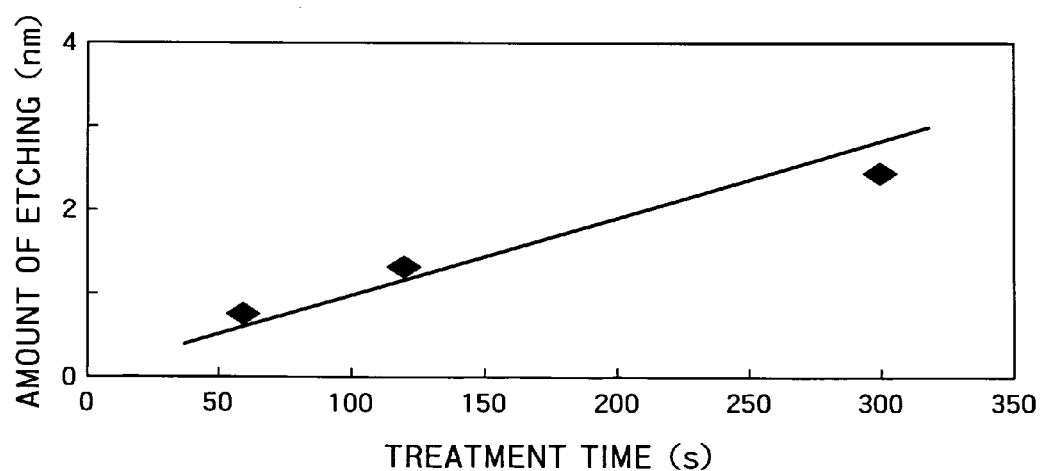
FIG. 5 shows a relationship between a treatment time and an amount of etching for explaining an embodiment according to the present invention.

In removing treatment for the residue 76 is desirably performed for sufficient long treatment time for which the residue 76 can be completely removed. However, the etching fluid has an etching operation to not only polymer but also an insulating film. In particular, the low-k insulating film used as the insulating film 68 has a low chemical resistance. For example, as shown in FIG. 5, the insulating film 68 is etched by unused etching fluid at an etching rate of about 0.01 nm/s. In this case, an amount of etching shown in FIG. 5 is an increasing amount of the width Da of the trench 74. In order to permissibly suppress a processing conversion difference of the width Db of the trench 74a, the time for treatment by the etching fluid is set at, for example, about 20 seconds.

Figure 6:
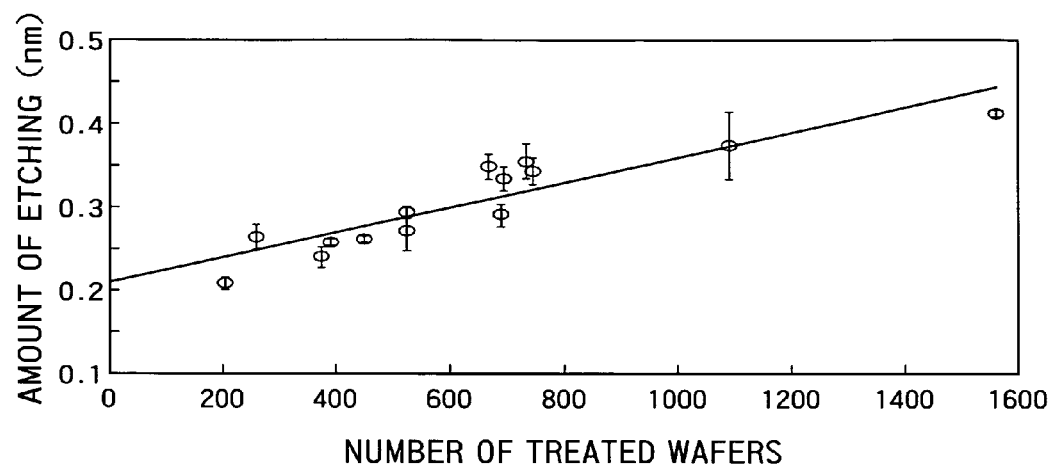
FIG. 6 shows a relationship between a treatment number of semiconductor wafers and an amount of etching for explaining an embodiment according to the present invention.

However, when the etching fluid is repeatedly used, as shown in FIG. 6, an amount of etching of the etching fluid increases with an increase in number of films to be treated. The polymer serving as the residue 76 contains fluorine (F) serving as a component of the reactive gas used in dry etching. When the polymer is dissolved in the etching fluid, an F concentration of the etching fluid increases. As a result, a hydrogen ion concentration (pH) of the etching fluid decreases.

Figure 7:
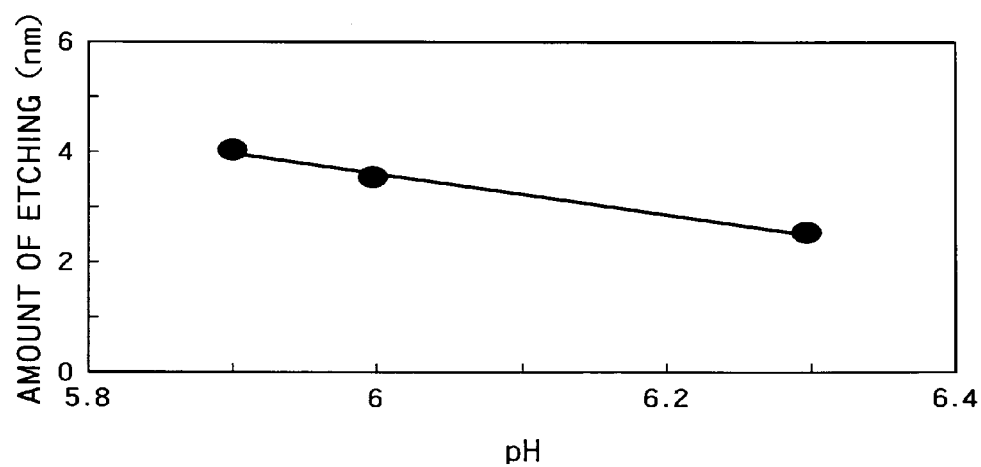
FIG. 7 shows a relationship between a characteristic and an amount of etching used for a residue treatment method of an embodiment according to the present invention.

For example, the pH of the unused etching fluid is about 6.3. The pH of the etching fluid after about 1500 films are treated decreases to about 5.9. As shown in FIG. 7, an amount of etching of an insulating film by etching fluid for predetermined treatment time, for example, about 200 seconds increases with a decrease in pH. More specifically, an etching rate of the etching fluid to the insulating film increases with the decrease in pH. As a result, for treatment time set by unused etching fluid, the width Db of the trench 74a increases with an increase in number of semiconductor wafers treated, and a processing conversion difference increases.

An etching rate of the insulating film is checked each time immediately before residue removal to make it possible to set treatment time to permissibly suppress a processing conversion difference in a range of tolerance. However, in this case, time required for the residue removing step increases by treatment time for checking an etching rate. As a result, an increase in manufacturing cost is caused.

The input unit 30 of the control unit 10 according to the embodiment acquires a value obtained by measuring a characteristic amount such as pH of the etching fluid in the treatment tank 12 immediately before the residue treatment. The pH is always measured by the measuring unit 16.

The correlation generator 32 generates a correlation between the pH of the reference etching fluid and the reference etching rate by etching the reference insulating film with the reference etching fluid in advance. The generated correlation is stored in the internal memory 40 or the external memory 24.

The rate calculator 34 calculates a target etching rate from the value obtained by measuring pH of the target etching fluid at the measuring unit 16 by using the correlation.

The time calculator 36 calculates treatment time for removing residue in a trench generated by dry etching of the target insulating film from the calculated target etching rate. For example, the treatment time is calculated such that a processing conversion difference of the width of the trench is permissibly suppressed.

The output unit 38 transmits the calculated treatment value to the output device 22. The internal memory 40 temporarily store data in calculation or data in analysis in an arithmetic operation in the control unit 10.

The input device 20 indicates a device such as a keyboard or a mouse. When an input operation is performed on the input device 20, corresponding key information is transmitted to the control unit 10. The output device 22 indicates a screen of a monitor or the like. As the output device 22, a liquid crystal display device (LCD), a light-emitting diode (LED) panel, an electro-luminescence (EL) panel, or the like can be used. The output device 22 displays the correlation created by the control unit 10, the calculated etching rate, the calculated treatment time, and the like. The external memory 24 stores a program to cause the control unit 10 to create correlation between the pH of the etching fluid and the etching rate, to calculate the etching rate or the treatment time. The internal memory 40 or the external memory 24 of the control unit 10 temporarily stores data in calculation or data in analysis in an arithmetic operation in the control unit 10.

According to the residue treatment system according to the embodiment, treatment time for the residue 76 in the trench 74 formed by dry etching is calculated on the basis of the pH of the etching fluid measured by the measuring unit 16. Therefore, even though the number of semiconductor wafers treated increases, the treatment time can be set to permissibly suppress a processing conversion difference of the trench 74a. Furthermore, since the etching rate can be checked by the pH which is always measured, an increase in time required for the residue removing step can be suppressed. In this manner, according to the residue treatment system of the embodiment, manufacturing cost can be reduced, and an increase in processing conversion difference can be suppressed.

Figure 8:
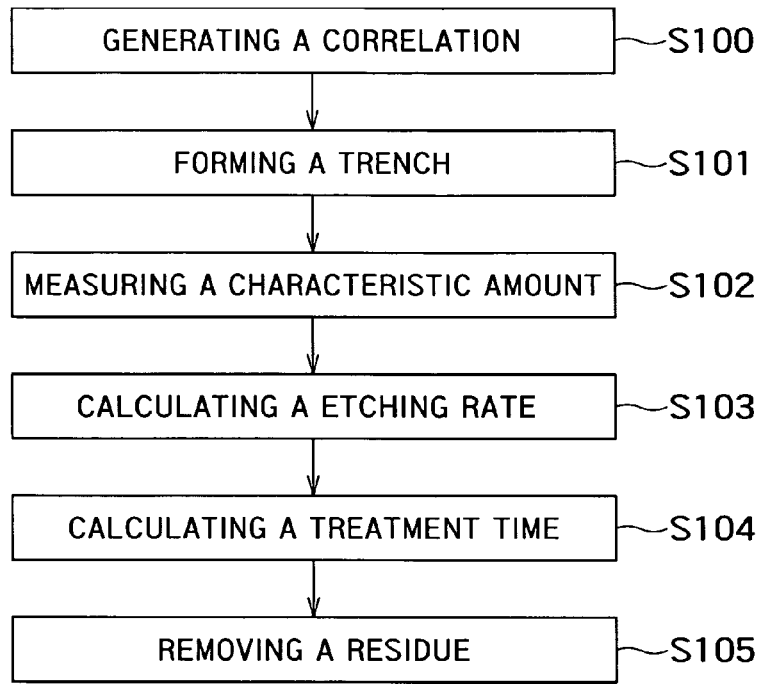
FIG. 8 is a flowchart showing an embodiment of a residue treatment method according to the present invention.

A method of manufacturing a semiconductor device using the residue treatment method according to the embodiment of the present invention will be described below with reference to the residue treatment system shown in FIG. 1 by using a flow chart shown in FIG. 8. A characteristic amount of etching fluid is pH, and an amount of etching of the etching fluid to an insulating film is an increase in width of a trench formed in the insulating film.

(A) In step S100, a characteristic amount of the reference etching fluid stored in the treatment tank 12 is measured by the measuring unit 16, and a reference insulating film prepared in advance is etched by the reference etching fluid. A reference etching rate to the reference insulating film is measured to generate correlation between the reference etching rate and the characteristic amount of the reference etching fluid by the correlation generator 32.

(B) In step S101, a target insulating film deposited on a semiconductor substrate is selectively removed by photolithography, dry etching, or the like to form a trench.

(C) In step S102, the measuring unit 16 measures a characteristic amount of target fluid newly stored in the treatment tank 12. The input unit 30 acquires a value obtained by measuring the characteristic amount.

(D) In step S103, the rate calculator 34 calculates a target etching rate of the target etching fluid from the measuring value of the characteristic amount by using the correlation.

(E) In step S104, the time calculator 36 calculates treatment time for residue generated by dry etching of the target insulating film and remaining in the trench from the target etching rate. The treatment time is set to be an amount of etching within the allowable range of a processing conversion difference of the trench.

(F) In step S105, in the treatment tank 12, treatment is performed by target etching fluid for the calculated treatment time to remove the residue from the trench.

(G) Thereafter, a metal is deposited on a surface of the target insulating film to bury the trench. The deposited metal is planarized to expose the surface of the target insulating film to form via plugs or interconnections.

In the residue treatment method according to the embodiment, treatment time for the residue in the trench formed in the target insulating film by the dry etching is calculated on the basis of the characteristic amount of the etching fluid measured by the measuring unit 16. Therefore, even though the number of semiconductor wafers treated, the treatment time can be set to permissibly suppress a processing conversion difference of the trench. Since the etching rate can be checked by pH which is always measured, an increase in time required for the residue removing step is suppressed. In this manner, according to the residue treatment method according to the embodiment, manufacturing cost can be reduced, and a processing conversion difference can be suppressed from increasing.

Another Embodiment

As described above, the embodiment of the present invention has been described. However, it should not be understood that the description and the drawings which partially constitute the disclosure of the embodiment limit the invention. From the disclosure, various alternative embodiments, examples, and operation techniques will be apparent to persons skilled in the art.

In the embodiment of the present invention, pH is used as a characteristic amount of etching fluid. However, the characteristic amount is not limited to pH. For example, an F (fluorine) concentration is used as a characteristic amount, and correlation between the characteristic amount and an etching rate may be created.

Figure 9:
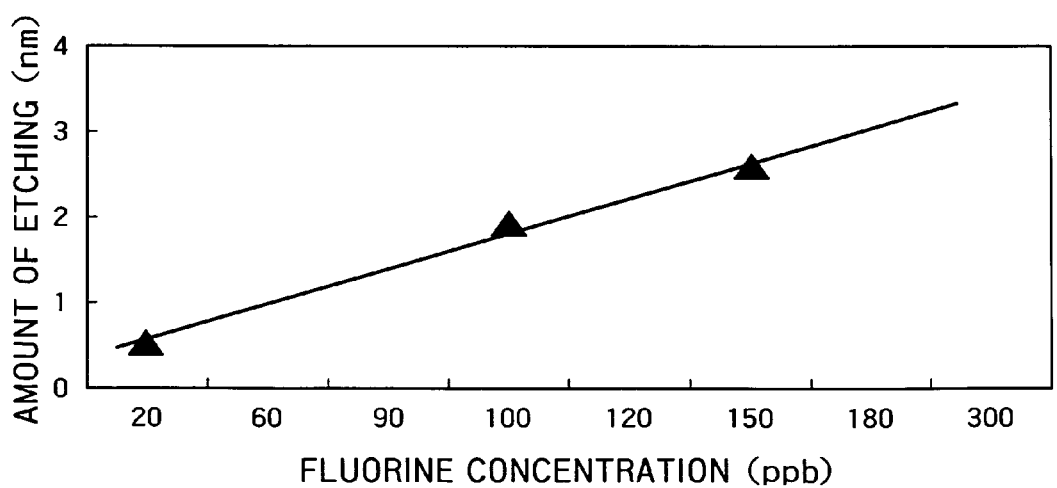
FIG. 9 shows a relationship between a characteristic amount and an amount of etching used for a residue treatment method of another embodiment according to the present invention.

For example, an F concentration of unused etching fluid is about 20 ppb. Polymer serving as the residue 76 contains F which is a component of a reactive gas used in dry etching. When the polymer is dissolved in the etching fluid, the F concentration of the etching fluid increases, and the F concentration of the etching fluid increases to about 150 ppb after about 1500 wafers are treated. As shown in FIG. 9, an amount of etching of an insulating film by the etching fluid for predetermined treatment time increase with the increase in F concentration. Therefore, the F concentration is used as a characteristic amount of the etching fluid to make it possible to suppress a processing conversion difference from increasing.

In this manner, the present invention includes various embodiments which are not described here as a matter of course. Therefore, from the above explanation, the spirit and scope of the present invention are determined by only a patent feature according to the appropriate scope of claims.

The processing conversion difference indicates a difference between an opening width of a trench or a via hole before the residue removal treatment and the opening width of the trench or the via hole after the residue removal treatment. A variation of the opening width of the trench or the via hole after the residue removal treatment is reduced, when the time of the residue removal treatment is set so that the processing conversion difference is held constant.

What is claimed is:

1. A method of manufacturing a semiconductor device comprising:

depositing a target insulating film on a semiconductor substrate;

selectively etching a part of the target insulating film by dry etching to form a trench;

measuring a value obtained by measuring a characteristic amount of target etching fluid which removes residue generated in the trench;

calculating treatment time for removing the residue on the basis of the measured value by using correlation between a characteristic amount of a reference etching fluid and a reference etching rate of a reference insulating film, the correlation being obtained by etching the reference insulating film with the reference etching fluid;

removing the residue with the target etching fluid for the calculated treatment time.

2. The method of manufacturing a semiconductor device according to claim 1, wherein the characteristic amount is pH of the etching fluid.

3. The method of manufacturing a semiconductor device according to claim 1, wherein the characteristic amount is a fluorine concentration of the target etching fluid.

4. The method of manufacturing a semiconductor device according to claim 1, wherein the time of the residue removal treatment is set so that a processing conversion difference is held constant, the processing conversion difference being a difference between an opening width of the trench before the residue removal treatment and the opening width of the trench after the residue removal treatment.

* * * * *